United States Patent [19]

Strongin et al.

[11] 4,237,151

[45] Dec. 2, 1980

[54] THERMAL DECOMPOSITION OF SILANE TO FORM HYDROGENATED AMORPHOUS SI FILM

[75] Inventors: Myron Strongin, Center Moriches; Arup K. Ghosh, Rocky Point; Harold J. Wiesmann, Wantagh, all of N.Y.; Edward B. Rock, Oxford, United Kingdom; Harry A. Lutz, III, Midlothian, Va.

[73] Assignee: The United States of America as represented by the United States Department of Energy, Washington, D. C. 20545

[21] Appl. No.: 52,278

[22] Filed: Jun. 26, 1979

[51] Int. Cl.$^3$ .............................................. C01B 33/02
[52] U.S. Cl. ................................. 427/74; 252/62.3 E; 427/84; 427/95; 428/428; 428/446; 423/349
[58] Field of Search .................... 423/349; 427/34, 84, 427/95; 428/446, 428; 252/62.3 E

[56] References Cited

U.S. PATENT DOCUMENTS

| | | | |
|---|---|---|---|
| 2,993,763 | 7/1961 | Lewis | 423/349 |
| 4,064,521 | 12/1977 | Carlson . | |
| 4,113,514 | 9/1978 | Pankove et al. | |
| 4,151,058 | 4/1979 | Kaplan et al. | |

OTHER PUBLICATIONS

Deneuville et al. "Thin Solid Films," vol. 55, No. 1, Nov., 1978 pp, 137–141, Elsevier Sequoia S. A. Lausanne.

*Primary Examiner*—Jack Cooper
*Attorney, Agent, or Firm*—James E. Denny; Richard G. Besha; Cornell D. Cornish

[57] ABSTRACT

This invention relates to hydrogenated amorphous silicon produced by thermally decomposing silano (SiH$_4$) or other gases comprising H and Si, at elevated temperatures of about 1700°–2300° C., and preferably in a vacuum of about 10$^{-8}$ to 10$^{-4}$ torr, to form a gaseous mixture of atomic hydrogen and atomic silicon, and depositing said gaseous mixture onto a substrate outside said source of thermal decomposition to form hydrogenated amorphous silicon.

5 Claims, 1 Drawing Figure

U.S. Patent  Dec. 2, 1980  4,237,151
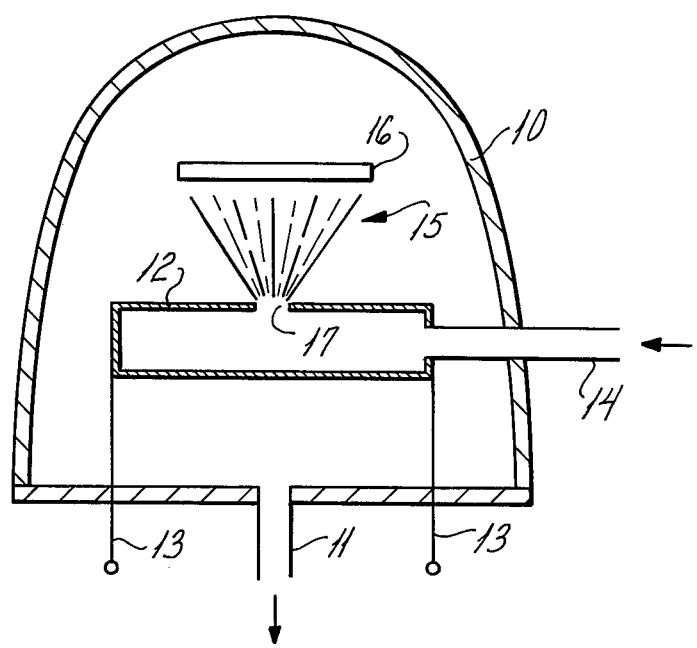

THERMAL DECOMPOSITION OF SILANE TO FORM HYDROGENATED AMORPHOUS SI FILM

BACKGROUND OF THE INVENTION

This invention was made under, or during, the course of, a contract with the U.S. Department of Energy.

This invention relates to a method of producing hydrogenated amorphous silicon which comprises thermally decomposing silane gas by passing said silane gas through a tungsten tube heated to about 1700° C. and up to 2100° C. or 2300° C. in vacuum to form a flux of atomic hydrogen and atomic silicon, depositing said flux onto a substrate by directing the stream of said flux at a substrate, which can be heated to a temperature less than 500° C., situated outside said tungsten tube, and recovering hydrogenated amorphous silicon.

Amorphous silicon is a material which has commercial application as a low cost photovoltaic material. However, the methods heretofore utilized in its preparation have limited its utility because of the presence of impurities and the failure of the removal of such impurities from the deposited amorphous silicon; as well as the non-uniformity in the electrical properties of the resultant deposited amorphous silicon film. This may have detrimental effects on electrical performance.

In addition, presently available processes of producing amorphous silicon, such as electron beam deposition, cause clusters of silicon to form, which are believed to degrade the properties of amorphous silicon.

It has now been found that in the present process, atomic silicon is deposited along with atomic hydrogen and the mean free path for collisions is long enough in the chamber so that clusters should not form. In addition, control of the temperature of the tungsten tube will control the decomposition compounds coming from the silane gas or other silicohydride gas. Another advantage of present process, which utilizes a high vacuum environment, is that it can be used in combination with electron beam deposition.

The hydrogenated amorphous silicon produced by present process will possess superior properties since the silicon will be purely atomic prior to deposition. It is further believed that the excellent properties of this material comes from the significant passivation of dangling (free)bonds present in pure amorphous silicon, with the atomic hydrogen that results from the silane decomposition.

Accordingly, it is a primary object of instant invention to provide hydrogenated amorphous silicon having particular utility as a photovoltaic material.

Another object of instant invention is to provide a process for the thermal decomposition of a silane into a gaseous mixture of atomic hydrogen and atomic silicon which is deposited on a substrate outside the source of thermal decomposition to form hydrogenated amorphous silicon.

Still another object of instant invention is to provide a hydrogenated amorphous silicon of improved and uniform electrical properties.

Still another object of instant invention is to provide an efficient process for producing a hydrogenated amorphous silicon film of controlled electrical properties.

Accordingly, present invention relates to a process of producing hydrogenated amorphous silicon which comprises thermally decomposing a gas containing silicon and hydrogen such as silane, disilane, trisilane, tetrasilane and the like into a mixture of atomic hydrogen and atomic silicon, and depositing said gaseous mixture onto a substrate situated outside the source of thermal decomposition, which may or may not be heated.

More specifically, the present process of producing hydrogenated amorphous silicon comprises decomposing a silane gas in a tungsten tube heated to a temperature of about 1700°–2100° C. in a vacuum of about $10^{-8}$ to $10^{-4}$ torr, into a gaseous mixture of silicon and atomic hydrogen and directing a stream of this mixture at a substrate outside the tungsten tube. Silane gas ($SiH_4$) is thermally dissociated in the tube forming a mixture of Si, H, SiH, $SiH_2$ and $SiH_3$. Control of the temperature of the tungsten tube will control the relative proportions of the decomposition compounds. At 1700° C., a greater proportion of $SiH_3$ and $SiH_2$ is formed than at 2100° C. This process also affords control of the silicon jet that leaves the thermal decomposition source, making for an efficient deposition process. Calculations show that rates of deposition of up to 10 monolayers/sec are possible with a pressure of about $10^{-4}$ torr in the vacuum chamber. This allows mass spectrographic control and determination of impurities, plus the combination with other deposition techniques, such as electron beam deposition. Present process provides for easier thermal decomposition compared to glow discharge decomposition of silane in the production of amorphous silicon.

PRIOR ART

The thermal decomposition of silane at elevated temperatures in the production of amorphous, polycrystalline or monocrystalline silicon is generally known in the prior art. For example, U.S. Pat. No. 2,993,763 to Lewis discloses the process of preparing flakes of sintered silicon by decomposing silane in a vacuum chamber to form a first layer of a brown amorphous silicon deposited on the walls of said chamber and subsequent layers of sintered silicon, heating the deposited silicon to a temperature above 450° C. by means of a heated silicon element such as a silicon rod located within said chamber to further sinter the silicon and form large silvery-grey flakes of sintered silicon. The Benzing et al U.S. Pat. Nos. 3,014,791 and 3,112,997 disclose an apparatus and method for the pyroylsis of silanes to form a high yield of crystalline silicon and a low yield of amorphous silicon which consists in introducing a mixture of silane and hydrogen or helium gas via a glass tube into a vacuum chamber provided with a fused quartz heating tube which is heated to about 600°–800° C., said heating tube being provided with protrusions whereon hyperpure polycrystals of dense silicon is deposited, whereas amorphous silicon deposits on the walls of the chamber, and the liberated hydrogen is removed from the chamber.

U.S. Pat. No. 3,765,960 to Boss et al discloses a method of minimizing autodoping during the deposition of epitaxial polycrystalline or amorphous layers of silicon on a heated silicon wafer which comprises contacting said wafer with a gaseous reaction mixture of hydrogen and silane at a temperature of 800°–1300° C., and at a pressure of 0.01 to 150 torr. U.S. Pat. No. 4,068,020 to Reuschel discloses the method of producing an amorphous silicon layer by pyrolytically depositing elemental silicon and a minor amount of at least one other element selected from Groups IV through VIII which are nonsemiconductive, from a gaseous reaction mixture containing thermally decomposable compounds of silicon and said second element, onto a substrate (mandrel) heated to 800°–1150° C., said substrate being the heating element as well. In all of aforesaid processes, a heating element heated to 450°–1100° C., which may be silicon or fused quartz, is placed in a chamber containing a silane atmosphere, and amorphous silicon is deposited on the walls of the chamber and/or the heating element within said chamber.

In the production of crystalline silicon, the heating element for decomposing the silane is also the substrate for collecting the crystalline silicon as disclosed in U.S. Pat. Nos. 3,078,015 to Raymond, 3,130,013 to Wilson et al, and 3,140,922 to Sterling wherein the seed crystal is both the substrate and the heating element. U.S. Pat. No. 3,147,141 to Ishizuka replaces the seed crystal of the above processes with a tantalum wire as both the heating element and the substrate. The use of the heating element as the substrate (carrier) for the crystalline silicon in the thermal decomposition of silane is also disclosed by U.S. Pat. No. 3,160,522 to Heywang, who uses temperatures slightly in excess of 1420° C. (the melting point of silicon) and a quartz, ceramic or metal carrier; U.S. Pat. No. 3,286,685 to Sandmann et al, who uses temperatures of 1100°–1400° C. and a silicon carrier; U.S. Pat. No. 3,496,037 to Jackson et al, who uses a sapphire substrate and a temperature of 850°–1000° C.; U.S. Pat. No. 3,607,054 to Conrod who grows a continuous filament crystal on a seed crystal of silicon; U.S. Pat. No. 3,796,597 to Porter who heat treats the spinel ($MgO.Al_2O_3$) substrate to a temperature of 1045°–1145° C. to modify its surface and then deposits crystalline silicon thereon; and U.S. Pat. No. 4,027,053 to Lesk who produces a ribbon of polycrystalline silicon on a heated quartz or tungsten substrate at a temperature of 1000°–1200° C.

U.S. Pat. No. 3,900,597 to Chruma et al places the substrate or carrier which are wafers of silicon, germanium, sapphire, spinel, ceramic, silicon dioxide, tungsten or molybdenum, into a quartz tube which is heated to 600°–700° C. under a vacuum of 600–1600 millitorrs; thereby disclosing a heating element which is separate from the substrate or carriers for the crystalline silicon. However, the wafer carriers or substrate are inside the heated quartz tube.

Although the prior art discloses the thermal decomposition of a gas containing hydrogen and silicon, such as silane, into amorphous and/or crystalline silicon which is deposited on the walls of the decomposition chamber, or on a substrate which also serves as the heating element or on a substrate situated within the thermal decomposition source (inside the heated tube); there is no disclosure of the production of hydrogenated amorphous silicon collected on an independent substrate situated outside the thermal decomposition source. The presence of the hydrogen in the amorphous silicon film is responsible for improved electrical and optical properties, the hydrogen compensating dangling bonds present in pure amorphous silicon; whereas amorphous silicon produced by evaporation or sputtering in a pure argon atmosphere has low resistivity (about $10^3$ ohms cm), poor photoconductivity and a high optical absorption below 1.5 eV.

DESCRIPTION OF THE INVENTION

The hydrogenated amorphous silicon according to present invention is produced by the thermal decomposition of a gas containing silicon and hydrogen such as the silicohydrides which include monosilane, disilane, trisilane and tetrasilane, at a temperature above the decomposition temperature of said gas, preferably about 1700°–2100° C. and under a vacuum of preferably about $10^{-6}$ to $10^{-4}$ torr into a flux (mixture) of silicon and hydrogen, and depositing said flux as a film on a substrate positioned outside said source of thermal decomposition.

These and other novel features of the invention will be better understood with reference to the following description of one embodiment thereof, given by way of example in conjunction with the accompanying drawing which is a diagrammatic view of a suitable form of apparatus for carrying out the invention.

The apparatus comprises a vacuum chamber 10 pumped down to a reasonable vacuum, about $10^{-6}$ torr, via outley pipe 11; a tungsten tube 12 positioned within said vacuum chamber 10 and heated by means of current leads 13 to a temperature preferably of about 1700° C., which is well above the decomposition temperature of silane (about 1000° C.). Silane is fed into said heated tungsten tube 12 via inlet pipe 14 wherein it decomposes into elemental silicon and atomic hydrogen; the flux of silicon and hydrogen 15 is then deposited on a substrate 16 through opening 17 in tungsten tube 12. Substrate 16 upon which the hydrogenated amorphous silicon condenses is placed above tube 12 and can be heated if desired to a temperature below 500° C., and preferably 225°–325° C., with the film quality at 325° being optimum. A temperature above 500° C. produces crystalline silicon. At 1700° C., appreciable hydrogen is generated which reacts with the silicon condensing on the substrate to yield amorphous-silicon-hydrogen alloy. At a temperature of 1700° C., elemental silicon has an appreciable vapor pressure approximately 1.8 torr; while the vapor pressure of tungsten is essentially negligible, which negates contamination of the silicon.

As the silane decomposes, the pressure in the vacuum chamber typically rises from $1 \times 10^{-6}$ to about $5 \times 10^{-4}$ torr which is the maximum pressure when heating the tungsten tube by electron beam bombardment. However, when using other means of heating the tungsten tube, higher pressures may be used, limited only by the fact that at higher pressures there is appreciable interaction between molecules in the gas phase which may or may not be desirable. It is preferable to maintain an ambient pressure of about $10^{-6}$ to $10^{-4}$ torr in the vacuum chamber and most preferably $10^{-5}$ to $10^{-4}$ torr.

The substrate, which may be sapphire, fused quartz, silicon, or other similar materials is placed about 6 inches away from the tube opening 17 in order to promote uniform coatings, and amorphous silicon film growth rates of about 1 Å/sec. However, the distance of the substrate from tube opening 17 may be varied between 1 and 12 inches to produce film growths of ~3 Å/sec.

In addition, conventional dopant gases can be added to the silane, if desired, via inlet pipe 14 prior to decomposition of the silane in heated tungsten tube 12.

Care is taken to avoid tungsten contamination of the films. This contamination was inferred from the effect of the temperature of the tungsten tube on the dark conductivity ($\sigma_d$) and the photoconductivity ($\sigma_p$). When the tungsten was heated to high temperatures (greater than 2100° C.), $\sigma_d$ was higher and $\sigma_p$ was lower than when the tungsten was kept at about 1700° C. Further reduction of the tungsten temperature had no beneficial effect. At a tungsten temperature of 2100° C., the tungsten contamination was less than 0.1% as determined by a microprobe analysis.

The base pressure of the system, prior to the silane decomposition, was $\sim 1 \times 10^{-6}$ torr. During deposition the pressure in the chamber rose to $\sim 5 \times 10^{-4}$ torr. This was indicative of the decomposition products of the silane gas. The decomposition products were collected on a heated substrate. The optimum substrate temperature was found to be approximately 325° C. Table I gives the growth conditions and parameters of the hydrogenated amorphous silicon films including the temperature of the substrate during deposition (Td), growth rate (R) operating pressure (P), and the resulting thickness of the films (D).

TABLE I

| Film | Substrate | Td(°C.) | R(Å/sec) | P(torr) | D(Å) |
|---|---|---|---|---|---|
| A | sapphire | 275 | 1.1 | $5 \times 10^{-4}$ | 1000 |
| B | sapphire | 325 | 2.4 | $5 \times 10^{-4}$ | 2400 |

Increasing the substrate temperature from 275°–325° C. decreases the overall hydrogen content in the films since higher substrate deposition temperatures reduce the multiply grouped hydrogen sites. The formation of SiH is less temperature dependent in this range than the formation of $SiH_2$ and $SiH_3$ groups. Similar behavior is observed for silane films.

Similarly, it has been found that for a fixed deposition temperature (325° C.) and a fixed partial pressure of hydrogen, the lower deposition rate produces the larger photocurrent. This is consistent with a higher percentage of hydrogen incorporated at the lower deposition rate.

On freshly grown films exposed to the atmosphere before measurement of their temperature dependence, it is found that dark conductivities are typically $10^{-9}$ to $10^{-11}$ ohms$^{-1}$ cm$^{-1}$. Thermal activation energies are 0.75 to 0.80 eV. Though initial growth parameters yield reproducible dark conductivities and photoconductivities the values of photoconductivity measured are $10^{-2}$ to $10^{-3}$ less than the highest values reported for silane films. The power law dependence for light intensity is between 0.7 and 0.9 for all temperatures and light intensity levels used.

It is understood that the foregoing detailed description is given merely by way of illustration and that variations may be made therein without departing from the spirit of the invention. The "Abstract" given above is merely for the convenience of technical searchers and is not to be given any weight with respect to the scope of the invention.

We claim:

1. A method of producing hydrogenated amorphous silicon which comprises thermally decomposing a silicohydride gas in a tungsten tube heated to a temperature of about 1700°–2300° C. and under a vacuum of about $10^{-8}$ to $10^{-4}$ torr to form a gaseous mixture of atomic hydrogen and atomic silicon, and depositing said gaseous mixture onto a substrate situated outside said heated tungsten tube by directing a stream of said gaseous mixture at said substrate, to form a film of hydrogenated amorphous silicon on said substrate.

2. A method in accordance with claim 1, wherein the silicohydride is silane.

3. A method in accordance with claim 1, wherein the substrate is heated to a temperature less than 500° C.

4. A method in accordance with claim 1, wherein the substrate is heated to a temperature of about 225°–325° C.

5. A method in accordance with claim 1, wherein the substrate is a material selected from the group consisting of sapphire, fused quartz and crystal silicon.

* * * * *